(12) United States Patent  
Ueno et al.

(10) Patent No.: US 7,883,278 B2  
(45) Date of Patent: Feb. 8, 2011

(54) OPTICAL MODULE AND OPTICAL TRANSMISSION DEVICE

(75) Inventors: Osamu Ueno, Kanagawa (JP); Junji Okada, Kanagawa (JP); Kazuhiro Sakai, Kanagawa (JP); Osamu Ohtani, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 10 days.

(21) Appl. No.: 11/355,964

(22) Filed: Feb. 17, 2006

(65) Prior Publication Data

US 2007/0003194 A1     Jan. 4, 2007

(30) Foreign Application Priority Data

Jul. 4, 2005     (JP) .............................. 2005-195018  
Jul. 5, 2005     (JP) .............................. 2005-196196

(51) Int. Cl.
| | |
|---|---|
| G02B 6/36 | (2006.01) |
| H01L 27/15 | (2006.01) |
| H01L 29/26 | (2006.01) |
| H01L 31/12 | (2006.01) |
| H01L 33/00 | (2006.01) |
| H01L 29/267 | (2006.01) |

(52) U.S. Cl. .............................. 385/93; 385/88; 385/92; 385/94; 257/79; 257/81; 257/99; 257/100

(58) Field of Classification Search ................... 385/88, 385/92, 93, 94; 257/79, 81, 99, 100  
See application file for complete search history.

(56) References Cited

U.S. PATENT DOCUMENTS 7,154,126 B2 * 12/2006 Aruga et al. ................... 257/98  
7,358,599 B2 *  4/2008 Ohe et al. ..................... 257/678  
2002/0167017 A1 * 11/2002 Nakabayashi et al. ......... 257/98

FOREIGN PATENT DOCUMENTS

| JP | A 5-63133 | 3/1993 |
|---|---|---|
| JP | A 11-121770 | 4/1999 |
| JP | A 2002-151704 | 5/2002 |
| JP | A 2002-344024 | 11/2002 |

* cited by examiner

*Primary Examiner* — Uyen-Chau N Le  
*Assistant Examiner* — John M Bedtelyon  
(74) *Attorney, Agent, or Firm* — Oliff & Berridge, PLC

(57) ABSTRACT

An optical module includes: a plurality of leads arranged in at least two lines, at least portions of the plurality of the leads being mounted on a circuit board; an optical semiconductor for emitting or receiving an optical signal; and a circuit portion connected to the optical semiconductor, for transmitting a pair of differential signals to or receiving a pair of differential signals from the circuit board through a pair of differential signal leads among the plurality of the leads. The pair of the differential signal leads are provided adjacent and in parallel to each other in one of the at least two lines.

11 Claims, 20 Drawing Sheets

FIG. 20 (a) PRIOR ART
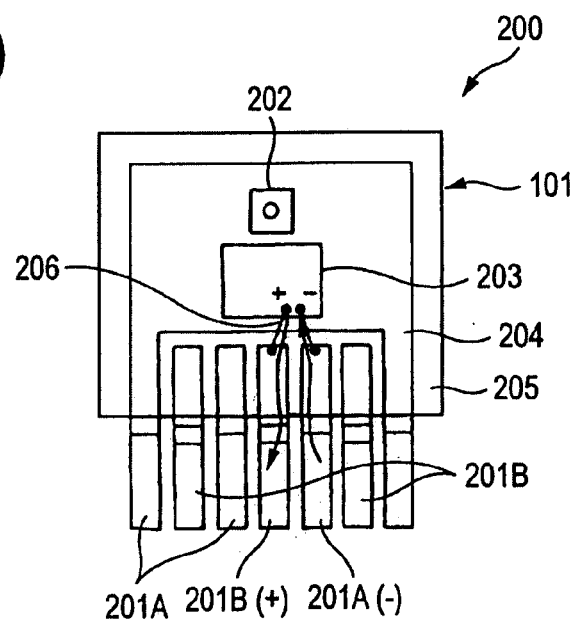
FIG. 20 (b) PRIOR ART
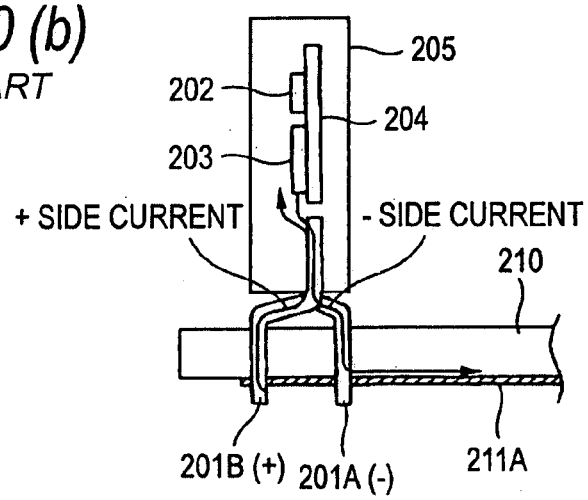
FIG. 20 (c) PRIOR ART
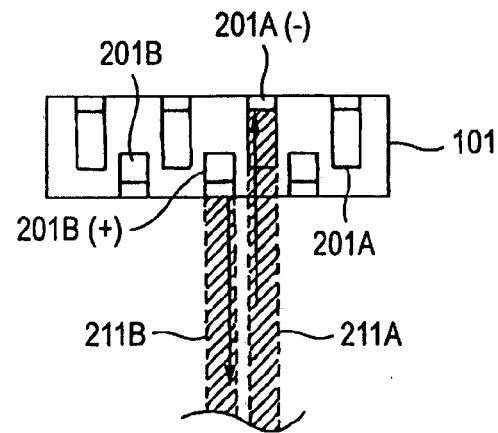

OPTICAL MODULE AND OPTICAL TRANSMISSION DEVICE

BACKGROUND OF THE INVENTION

1. Field of the Invention

The present invention also relates to an optical module and an optical transmission device and, in particular, to an optical module and an optical transmission device for transmitting an optical signal on the basis of positive and negative differential signals or converting a received optical signal into positive and negative differential signals.

2. Description of the Related Art

In the optical communication, a low cost optical module having an optical semiconductor such as a light emitting element or a light receiving element and an optical transmission device utilizing such optical module have been used. An optical transmission device of such kind, in which an optical semiconductor is mounted and sealed on a lead frame and a plurality of leads arranged in one line are derived from the sealed optical semiconductor so that the lead frame can be through-mounted on a circuit board, is known. (see, for example, JP-A-2002-344024 and JP-A-2002-151704).

FIGS. 18(a) to 18(c) show the related art optical module, in which FIG. 18(a) is a front view of the related art optical module 100, FIG. 18(b) is a side view thereof and FIG. 18(c) is a bottom view thereof. The optical module has the SIP (Single In-line Package) type construction, in which leads arranged in one line are derived.

The optical module 100 includes a body portion 101 in which an optical semiconductor and a drive IC, which are not shown, mounted on a lead frame and sealed by a resin package and a plurality of leads 102 arranged in one line and derived from one side of the body portion 101, as shown in FIG. 18(a).

The leads 102 are identical in configuration and length and are regularly arranged in the line at a constant pitch as shown in FIGS. 18(a) and 18(c). In order to through-mount the optical module 100 on the circuit board, through-holes 103 each having diameter slightly larger than an outer size of the lead 102 are provided in the circuit board. Therefore, it is necessary to make pitch p of the leads 102 larger than diameter d, which includes clearance with respect to the diameter of the through-hole 103. That is, pitch p of the leads 102 is limited by the size of the through-hole 103 and it is impossible to provide pitch p smaller than a certain distance. Incidentally, FIG. 18(c) shows an example in which the through-holes 103 cannot be provided.

Recently, compactness and high performance of an optical module have been required, so that it is requested that a number of leads can be derived from the optical module. However, since it is necessary to consider the through-holes 103 in the SIP type optical module as mentioned above, it is difficult to reduce the pitch of the leads 102. In order to solve this problem, the ZIP (Zigzag In-line Package) type optical module is provided.

FIGS. 19(a) to 19(c) show a related art ZIP type optical module 200, in which FIG. 19(a) is a front view thereof, FIG. 19(b) is a cross sectional view thereof and FIG. 19(c) is a bottom view thereof.

This optical module 200 is called as ZIP type optical module having a plurality of zigzag arranged leads. As shown in FIGS. 19(a) and 19(b), the optical module 200 includes a light emitting element 202 such as a laser diode, a drive IC 203 for driving the light emitting element 202, a lead frame 204 on which the light emitting element 202 and the drive IC 203 are mounted, a plurality of leads 201A and 201B including differential signal leads 201A(−) and 201B(+), a sealing member 205 of transparent insulative material, for sealing other portion than the plurality of the leads 201A and 201B and bonding wires 206 for connecting differential signal input terminals of the drive IC to terminals of the leads 201A(−) and 201B(+).

Since the leads 201A and 201B of this optical module 200 are arranged in two lines, it is possible to reduce the pitch p of the leads compared with the optical module 100 having the leads arranged in one line as shown in FIGS. 18(a) to 18(c). Further, since the leads are arranged in the two lines, it is possible to make the optical module 200 hard to fall on a circuit board when the optical module 200 is mounted on the circuit board.

The recent request of compactness and high performance (high operation speed) of the optical module is also spread to low cost optical modules. One of measures for increasing the operation speed is to obtain differential signals having opposite polarities by supplying a modulation signal to a differential circuit and to drive, for example, the light emitting element on the basis of the differential signals.

FIG. 3 shows waveforms of an input signal S for operating the differential circuit included in a circuit portion of the body portion 101 of FIGS. 19(a) to 19(c). The input signal S is composed of a positive differential signal S+ and a negative differential signal S−. The circuit portion, which operates with the paired signals S+ and S−, generates an output signal, which is a difference signal between the differential signals S+ and S−, and the light emitting element 202 is driven by the output signal.

It is ideal that the input signal S contains only signal component without any noise mixed therein. However, there may be a case where noise SN overlaps on the differential signals S+ and S−, as shown in FIG. 3. In such case, in-phase noise SN are cancelled out in the differential circuit operated by the differential signals S+ and S−, so that the noise SN does not appear at an output terminal of the differential circuit. For this reason, the paired differential signals S+ and S− are used.

FIGS. 20(a), 20(b) and 20(c) show flows of the differential signals S+ and S− in the optical module 200 and the circuit board. In FIGS. 20(a) to 20(c), it is assumed that the adjacent two leads 201A(−) and 201B(+) are leads for inputting the differential signals S+ and S−. Further, it is assumed that the optical module 200 is mounted on a circuit board 210 having wiring patterns 211A and 211B, as shown in FIG. 20(b).

One ends of the differential signal leads 201A(−) and 201B(+) are connected to differential signal input terminals (+) and (−) on the drive IC 203, respectively, and the other terminals thereof are connected to the wiring patterns 211A and 211B on the circuit board 210, respectively. When the differential signals S+ and S− are supplied to the wiring patterns 211A and 211B, a positive (+) side current and a negative (−) side current flow to the wiring patterns 211A and 211B and the leads 201A(−) and 201B(+) along directions shown by arrows in FIGS. 20(a), 20(b) and 20(c).

However, in the related art optical module 200 having the lead structure shown in FIGS. 19(a) to 19(c), there is a portion extending from the sealing member 205, in which the transmission routes of the differential signal leads 201A(−) and 201B(+) are different from each other, as shown in FIGS. 20(b) and 20(c).

Therefore, the cancellation effect of noise SN is reduced, so that there are problems that there is a phase difference and that the signal quality and noise characteristics become worse in a frequency band of gigabits or higher. Incidentally, the same problems occur in an optical module constructed with a light receiving element as the light emitting element 202 and a signal processing IC as the drive IC 203.

SUMMARY OF THE INVENTION

The present invention provides an optical module, which has superior transmission characteristics for a differential signal, is capable of transmitting signal at high speed and can be downsized, and an optical transmission device utilizing the same optical module.

According to a first aspect of the present invention, there is provided an optical module including a plurality of leads arranged in at least two lines, at least portions of the plurality of the leads being mounted in a circuit board, an optical semiconductor for emitting or receiving an optical signal and a circuit portion connected to the optical semiconductor, for transmitting a pair of differential signals to or receiving the differential signals from the circuit board through a pair of differential signal leads among the plurality of the leads, wherein the paired differential signal leads are arranged adjacent and in parallel to each other in one line.

According to the above mentioned optical module, it is possible to form an ideal differential signal route, which includes the leads and the wiring pattern on the circuit board, by arranging the paired differential signal leads adjacent and in parallel to each other.

According to a second aspect of the present invention, an optical transmission device is provided. The optical transmission device includes an optical module including a circuit board having a pair of differential signal lead patterns supplied with a pair of differential signals, a plurality of leads arranged in at least two lines and mounted on the circuit board, an optical semiconductor for emitting or receiving an optical signal and a circuit portion connected to the optical semiconductor, for transmitting the paired differential signals to or receiving the paired differential signals from the circuit board through a pair of differential signal leads among the plurality of the leads, wherein the pared differential signal leads are arranged in parallel in one of the two lines and the paired differential signal lead patterns are arranged adjacent and in parallel to each other.

According to the above mentioned optical transmission device, it is possible to form ideal signal routes of the differential signals, which include the leads and the wiring patterns on the circuit board, by arranging the paired differential signal leads of the optical module adjacently in parallel.

According to the present invention, superior transmission characteristics for the differential signals and high speed signal transmission can be realized and down sizing of the optical module and the optical transmission device becomes possible.

BRIEF DESCRIPTION OF THE DRAWINGS

Embodiments of the present invention will be described in detail based on the following figures, wherein:

FIGS. 2(a) and 2(b) show an optical module shown in FIG. 1, in which FIG. 2(a) is a front view and FIG. 2(b) is a cross sectional view taken along a line A-A in FIG. 2(a);

FIGS. 5(a) and 5(b) show outer configurations of a second lead frame and a first lead frame, on which a light emitting element and a drive IC are mounted, in the second embodiment, in which FIG. 5(a) is a front view and FIG. 5(b) is a side view;

FIGS. 6(a) and 6(b) show an outer configuration of the first and second lead frames in the second embodiment, in which FIG. 6(a) is a front view of the second lead frame and FIG. 6(b) is a front view of the first lead frame on which a light emitting element and a drive IC are mounted;

FIGS. 12(a) to 12(c) show an operation of the optical transmission device according to the fourth embodiment, in which FIG. 12(a) shows current flow in the optical module, FIGS. 12(b) and 12(c) show current flows in wiring patterns of a circuit board;

FIGS. 13(a) and 13(b) show an optical module according to a fifth embodiment of the present invention, in which FIG. 13(a) is a front view of the optical module and FIG. 13(b) is a bottom view thereof;

FIGS. 14(a) to 14(c) show an optical module according to a sixth embodiment of the present invention, in which FIG. 14(a) is a front view of the optical module, FIG. 14(b) is a cross sectional side view thereof mounted on the circuit board and FIG. 14(c) is a bottom view thereof;

FIGS. 15(a) to 15(c) show an optical module according to a seventh embodiment of the present invention, in which FIG. 15(a) is a perspective view of the optical module, FIG. 15(b) is a cross sectional side view thereof and FIG. 15(c) is a bottom view thereof;

FIGS. 18(a) to 18(c) show a related art optical module, in which FIG. 18(a) is a front view of the optical module, FIG. 18(b) is a side view thereof and FIG. 18(c) is a bottom view thereof;

FIGS. 19(a) to 19(c) show another related art optical module, in which FIG. 19(a) is a front view of the optical module, FIG. 19(b) is a side view thereof and FIG. 19(c) is a bottom view thereof; and FIGS. 20(a) to 20(c) show flows of a pair of differential currents in the optical module and the circuit board shown in FIGS. 19(a) to 19(c), in which FIG. 20(a) shows current flows in the optical module and FIGS. 20(b) and 20(c) show flows of the differential currents in wiring patterns of the circuit board.

DETAILED DESCRIPTION OF THE INVENTION

First Embodiment

Figure 1:
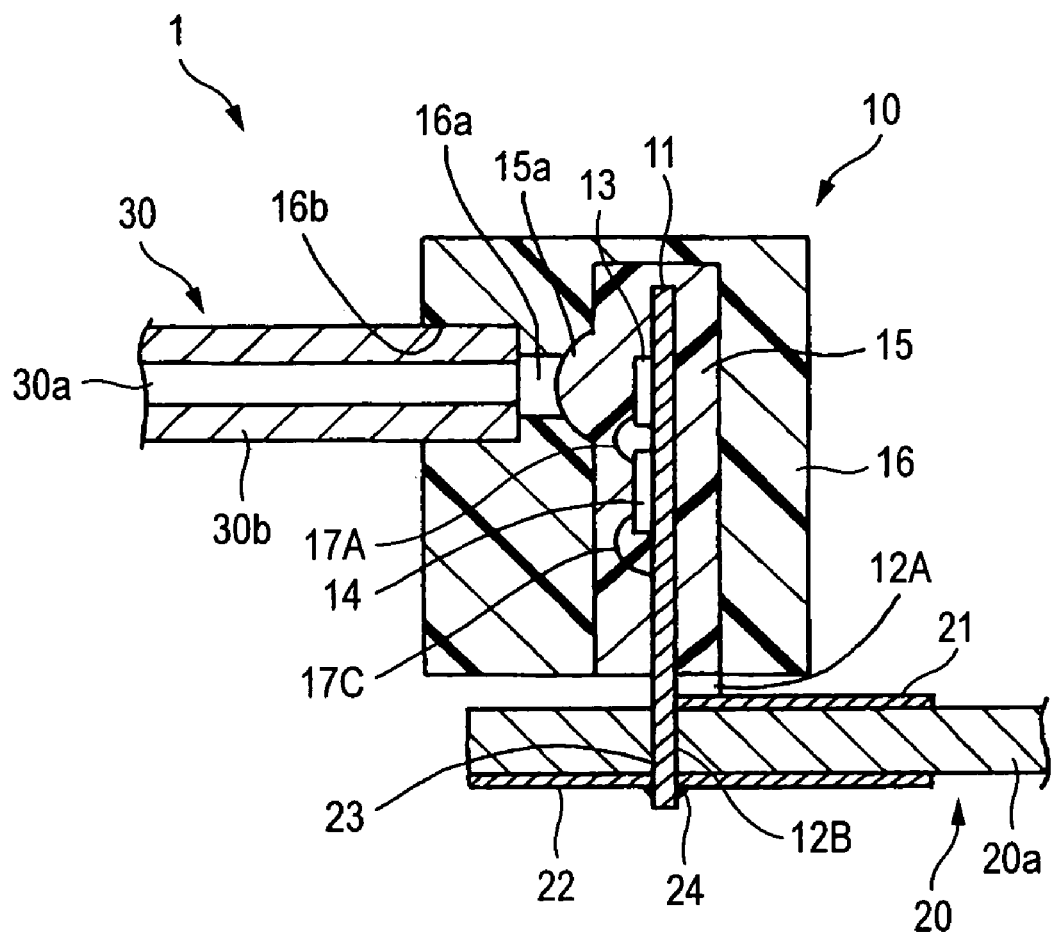
FIG. 1 is a cross sectional view of an optical transmission device according to a first embodiment of the present invention.

FIG. 1 shows an optical transmission device according to a first embodiment of the present invention and FIGS. 2(a) and 2(b) show an optical module, in which FIG. 2(a) is a front view and FIG. 2(b) is a cross section of the optical module taken along a line A-A in FIG. 2(a).

(Construction of the Optical Transmission Device)

The optical transmission device 1 includes an optical module 10 for transmitting an optical signal through an optical fiber 30 and a circuit board 20 on which the optical module 10 is mounted.

The optical module 10 includes a lead frame 11 having a second lead portion 12B, a first lead portion 12A, which is separated from the lead frame 11 in a manufacturing process, a light emitting element 13 as an optical semiconductor mounted on the lead frame 11, a drive IC 14 as a circuit portion mounted on the lead frame 11, a first sealing member 15 sealing a portion of the lead frame 11, on which the light emitting element 13 and the drive IC 14 are mounted, with a material such as optically transparent resin, in such a way that a lens 15a is formed on a light emitting face of the light emitting element 13, and a second sealing member 16 sealing the first sealing member 15 with a material such as resin in such a way that the space 16a is formed in front of the lens 15a and the insertion portion hole 16b for receiving the end portion of the optical fiber 30 is provided.

Incidentally, since the second sealing member 16 is to fix the optical fiber 30, it is unnecessary in the optical transmission device 1 having a construction in which the optical fiber 30 is not connected and held. The second sealing member 16 is not shown in FIGS. 2(a) and 2(b).

As shown in FIG. 2(a), the first lead portion 12A includes four leads, a power supply lead 12Aa, differential signal leads 12Ab and 12Ac for differential signals (S+ and S−) and a control signal lead 12Ad. In order to surface-mount the optical module on the circuit board 20, end portions (lower end portions) of these leads 12Aa to 12Ad are bent to form L-shapes extending along a lower surface of the first sealing member 15 as shown in FIG. 2(b). Since the optical module 10 is usually arranged on a peripheral area of the circuit board 20, the bending direction of the first lead portion 12A is opposite to the setting direction of the light emitting element 13, in order to avoid wasteful extension of the wiring pattern.

The power supply lead 12Aa is connected to the drive IC 14 by a bonding wire 17B and the differential signal leads 12Ab and 12Ac are connected to the drive IC 14 by bonding wires 17C and 17D, respectively. Further, the control signal lead 12Ad is connected to the drive IC 14 by a bonding wire 17E.

The second lead portion 12B includes a pair of grounding leads 12Ba and 12Bb, which are extended from the lead from 11 for the through-mounting, as shown in FIG. 2(a). The grounding leads 12Ba and 12Bb, between which the differential signal leads 12Ab and 12Ac are arranged, have the same length and are formed in parallel in one and the same plane.

The light emitting element 13 may be a surface emitting type laser. An output terminal of the drive IC 14 and the light emitting element 13 are connected each other by the bonding wire 17A. A grounding terminal of the drive IC 14 is connected to the lead frame 11 by a bonding wire 17F.

As shown in FIG. 1, the circuit board 20 includes a base member 20a of such as epoxy resin and, on an upper surface of the base member 20a, a pair of differential signal wiring pattern 21 connected to the differential signal leads 12Ab and 12Ac, a power supply wiring pattern and a control signal wiring pattern, which are not shown, are formed. On a lower surface of the base member 20a, a grounding wiring pattern 22 connected to the grounding leads 12Ba and 12Bb is formed. In order to improve the signal characteristics of the optical transmission device, the grounding wiring pattern 22 is formed immediately below the differential signal wiring pattern 21.

The circuit board 20 has a pair of through-holes 23, through which the grounding leads 12Ba and 12Bb pass. Through-holes 23 are connected to the grounding wiring pattern 22. Further, IC's and electronic parts may be mounted on the circuit board 20.

The optical fiber 30 takes in the form of a cable including a core 30a for transmitting an optical signal and a clad 30b having refractive index smaller than that of the core 30a.

(Mounting of the Optical Module)

Now, the mounting of the optical module 10 on the circuit board 20 will be described. As shown in FIG. 1, the second sealing member 16 is provided for the optical module 10 in the state shown in FIG. 2(b). The optical module 10 is mounted on the circuit board 20 by inserting the grounding leads 12Ba and 12Bb into the through-holes 23 of the circuit board 20 and making the leads 12Aa to 12Ad in contact with the differential signal wiring pattern 21 and other wiring patterns on the upper surface of the circuit board 20. The optical module 10 is mounted on the circuit board 20 through usual reflow process and flow process while keeping this state. Thus, the top ends of the grounding leads 12Ba and 12Bb are connected to the grounding wiring pattern 22 by solder portions 24.

(Operation of the Optical Transmission Device)

Now, the operation of the optical transmission device 1 will be described with reference to FIGS. 1 to 3. FIG. 3 shows waveforms of the differential signals supplied to the differential signal leads 12Ab and 12Ac.

First, a predetermined DC voltage is applied between the power supply lead 12a and the grounding lead portions 12Ba and 12Bb. Then, the differential signals S+ and S− having the waveforms shown in FIG. 3 are supplied to the differential signal leads 12Ab and 12Ac at high speed through the paired differential signal wiring patterns 21 on the circuit board 20. By this supply of differential signals S+ and S− to the respective differential signal leads 12Ab and 12Ac, the drive IC 14 starts to operate. The drive IC 14 generates an output signal corresponding to a difference between the differential signals S+ and S− and the light emitting element 13 is driven by the output signal of the drive IC. Thus, the light emitting element 13 emits light correspondingly to the waveforms shown in FIG. 3. Light emitted by the light emitting element 13 is condensed to the end portion of the optical fiber 30 by the lens 15a and transmitted through the core 30a as an optical signal.

It is ideal that the differential signals S+ and S− have only signal components without external noise mixed therein. However, there may be a case where noises SN overlaps on the differential signals S+ and S− as shown in FIG. 3. In such case, in-phase noises SN are cancelled out in the drive IC 14, which is operated by the differential signals S+ and S−, so that noise does not appear at the output terminal of the drive IC 14. For this reason, the paired opposite phase differential signals S+ and S− are used.

Effect of the First Embodiment

According to the first embodiment, the following effects are obtained.

(a) Since the differential signal leads 12A*b* and 12A*c* can be surface-mounted, the differential signal leads 12A*b* and 12A*c* can be connected to the differential signal wiring pattern 21 on the circuit substrate 20 through the shortest route. Therefore, impedance of the connecting route of the differential signal leads 12A*b* and 12A*c* becomes low so that high speed signal transmission in G bps range or higher.

(b) Since the grounding leads 12B*a* and 12B*b* are through-mounted on the circuit substrate 20, it is possible to connect them to the grounding pattern 22 on the circuit board 20 with low impedance. Therefore, high speed signal transmission in G bps range or higher can be realized.

(c) Formation of an opening portion in the grounding area of the circuit board 20 can be avoided by limiting through-mounted leads to only the grounding leads 12B*a* and 12B*b*. Therefore, it is possible to provide a superior grounding construction.

(d) Since the grounding leads 12B*a* and 12 B*b* are through-mounted, it becomes possible to mechanically firmly couple the grounding leads on the circuit board 20. Therefore, the mechanical reliability off the optical module and the optical transmission device can be improved.

(e) The lead portions 12A*a* to 12A*d*, which are surface-mounted, can be controlled by making the lead pitch smaller correspondingly to impedance. Therefor, the freedom of design can be improved.

(f) The mounting of the optical module 10 on the circuit board 20 can be done easily through the usual reflow process and the flow process.

(g) Since the optical module 10 is usually arranged in the peripheral portion of the circuit board 20, it is possible to avoid waste in deriving such as the signal leads 12A*b* and 12A*c* by changing the bending direction of the first lead portion 12A backward.

(h) The signal characteristics can be improved by overlapping the differential signal wiring pattern 21 and the grounding wiring pattern 22 of the circuit board 20 through the substrate member 20*a*.

Second Embodiment

Figure 4:
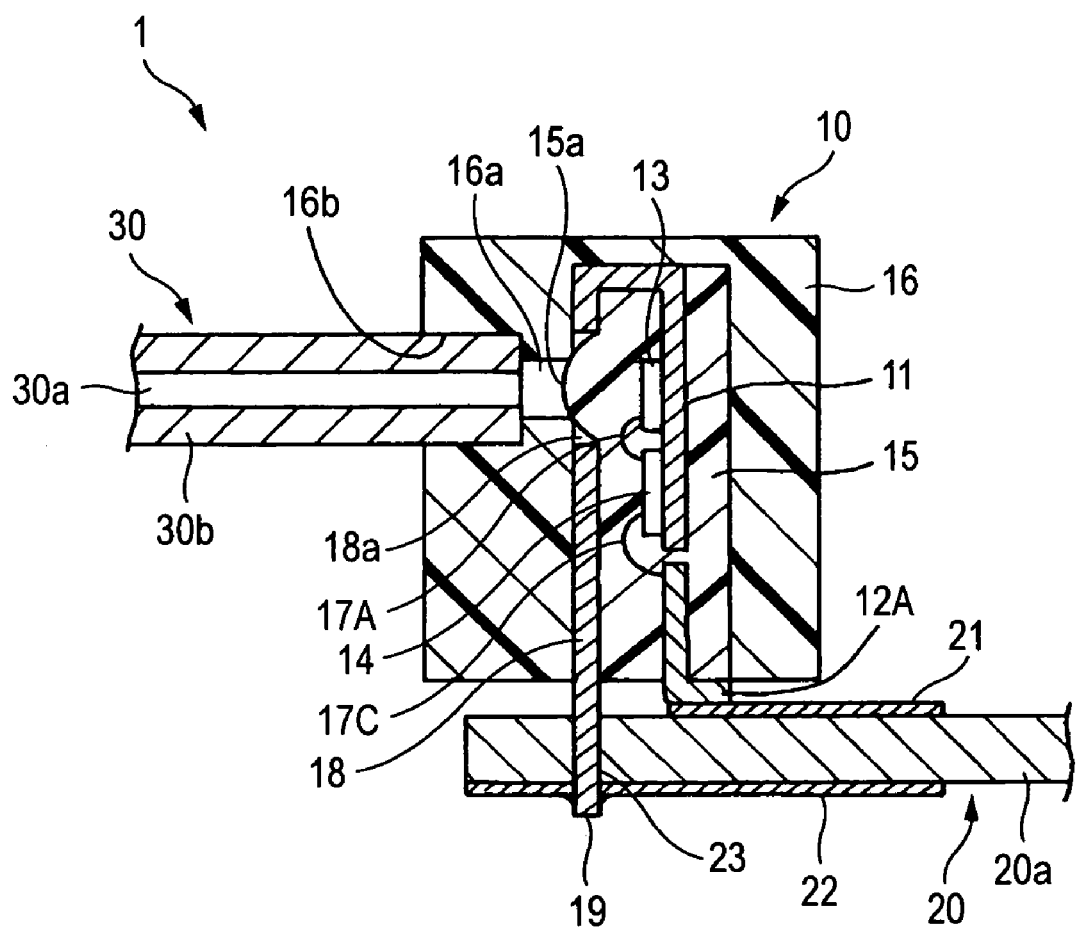
FIG. 4 is a cross sectional view of an optical module according to a second embodiment of the present invention.

FIG. 4 shows an optical module according to a second embodiment of the present invention. The second embodiment differs from the first embodiment in that a second lead frame 18 is arranged in a position, which is remote from the lead frame (referred to as "first lead frame", hereinafter) 11 by a predetermined distance, in an opposing relation to the first lead frame 11. Other construction of the optical module of the second embodiment is substantially the same as that of the first embodiment.

The second lead frame 18 is prepared together with the first lead frame 11 by punching a metal plate. The second lead frame 18 has substantially the same configuration as that of the first lead frame 11 and opposes to a front surface of the first lead frame 11. The second lead frame 18 is bent such that the second lead frame 18 together with the first lead frame 11 forms an inverted "U" shape in side view. An opening 18*a* is formed in the second lead frame 18 at a position thereof correspondingly to the lens 15*a*.

Figure 5:
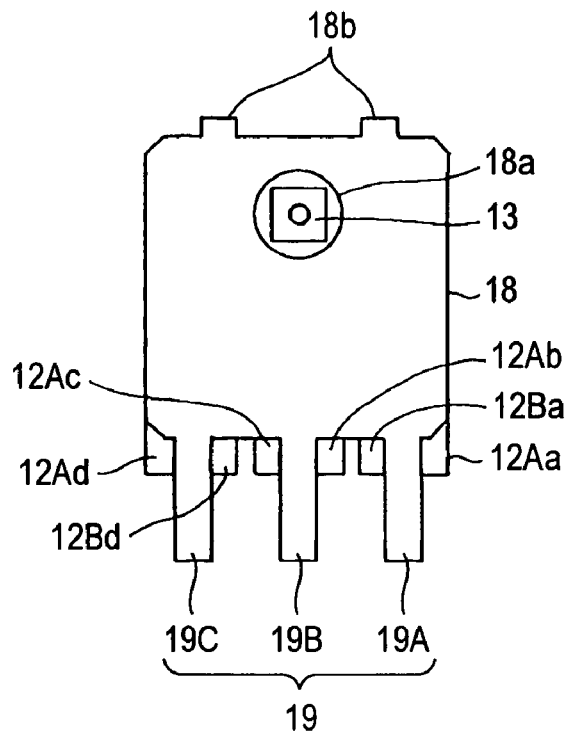
Figure 5:
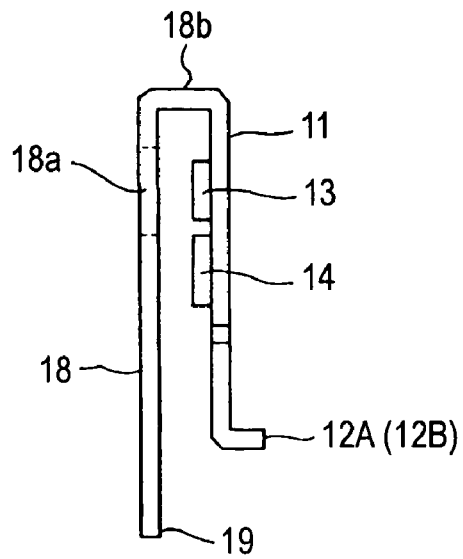

FIGS. 5(*a*) and 5(*b*) show the second lead frame and the first lead frame mounting the light emitting element and the drive IC, in which FIG. 5(*a*) is a front view and FIG. 5(*b*) is a side view. Further, FIGS. 6(*a*) and 6(*b*) show a contour of the first and second lead frames, in which FIG. 6(*a*) is a front view of the second lead frame and FIG. 6(*b*) is a front view of the first lead frame mounting the light emitting element and the drive IC before the bending process.

Figure 6:
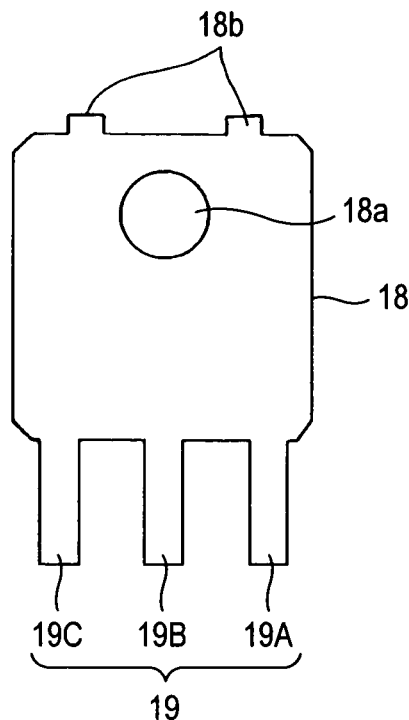
Figure 6:
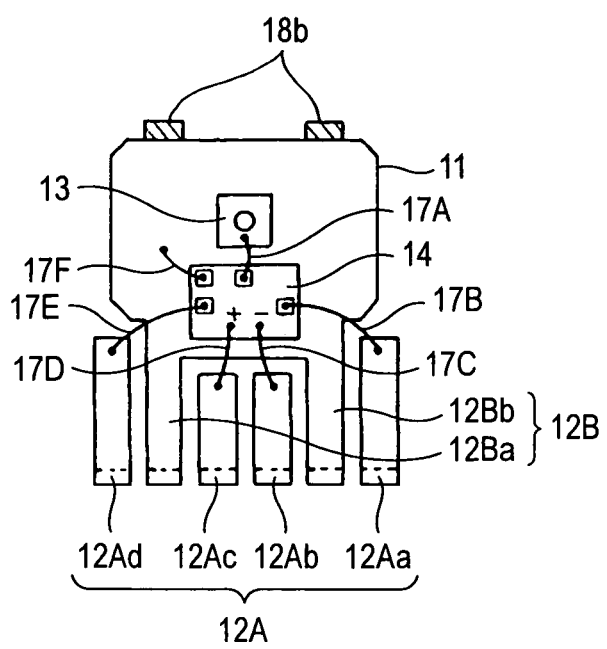

As shown in FIGS. 5(*a*), 5(*b*) and FIG. 6(*a*), the second lead frame 18 is connected to the first lead frame 11 by a pair of belt-like connecting portions 18*b*. The lead frames 11 and 18 are arranged in an opposing relation by bending opposite root portions of the connecting portions 18*b* at a right angle.

Further, a third lead portion 19 composed of three grounding leads 19A, 19B and 19C is provided in a lower end of the second lead frame 18. The grounding leads 19A to 19C are through-mounted on the circuit board 20.

Figure 2:
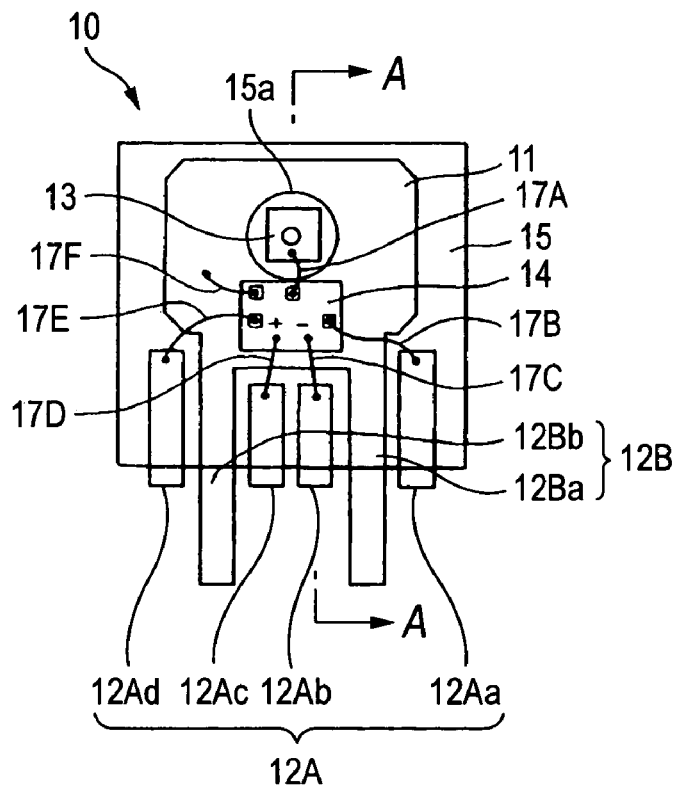
Figure 2:
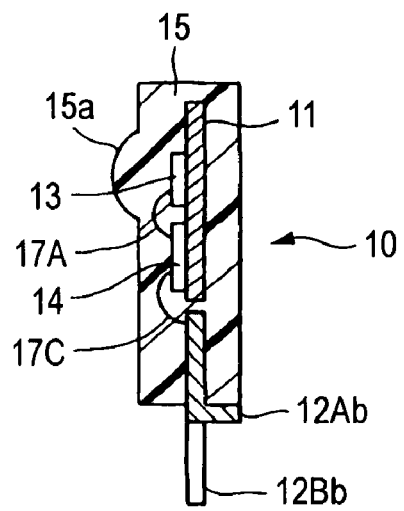
Figure 3:
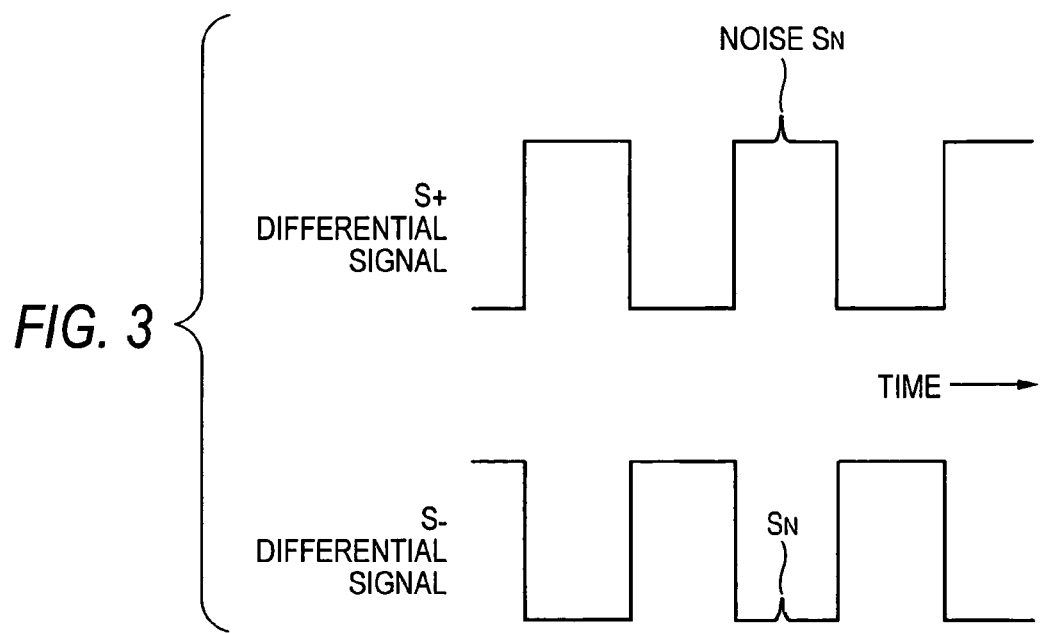
FIG. 3 shows waveforms of differential signals S+ and S- applied to a pair of differential signal leads shown in FIGS. 2(a) and 2(b)

As shown in FIG. 6(*b*), the first lead frame 11 has substantially the same configuration as that of the first embodiment shown in FIG. 2(*a*). However, lower end portions of the first and second lead portions 12A and 12B are bent backward as shown in FIG. 5(*b*) and FIG. 6(*b*). In this case, the grounding leads 12B*a* and 12B*b* are also bent and surface-connected to the wiring pattern on the upper surface of the circuit board 20.

In the first embodiment, the mechanical coupling with the circuit board 20 is provided by the grounding leads 12B*a* and 12B*b*. In the second embodiment, this function is provided by the grounding leads 19A to 19C. Therefore, in the second embodiment, the grounding leads 12B*a* and 12B*b* are surface-mounted.

Since the mounting method of the optical module 10 on the circuit board 20 and the operation of the optical transmission device 1 in the second embodiment are the same as those described with reference to the first embodiment, the description thereof are omitted.

Effects of the Second Embodiment

According to the second embodiment, the following effects are obtained in addition to the effects obtained by the first embodiment.

(a) Since the first and second lead frames 11 and 18 are formed from a lead frame plate, it is possible to form a good grounding plate at low cost.

(b) Since the light emitting element 13 and the drive IC 14 are arranged between the first lead frame 11 and the second lead frame 18 and the first and second lead frames 11 and 18 shield these elements, it is possible to reduce influence of noise of external origin.

(c) With the opening 18*a* provided in the second lead frame 18 in the opposing relation to the lens 15*a*, it is possible to transmit the optical signal from the light emitting element 13 to the optical fiber 30 smoothly while keeping superior anti noise characteristics and light transparency.

(d) Since, in the optical module 10 and the circuit board 20, the signal routes of the differential signals and grounding portions are formed at even interval, high speed reliable optical transmission can be realized.

Third Embodiment

Figure 7:
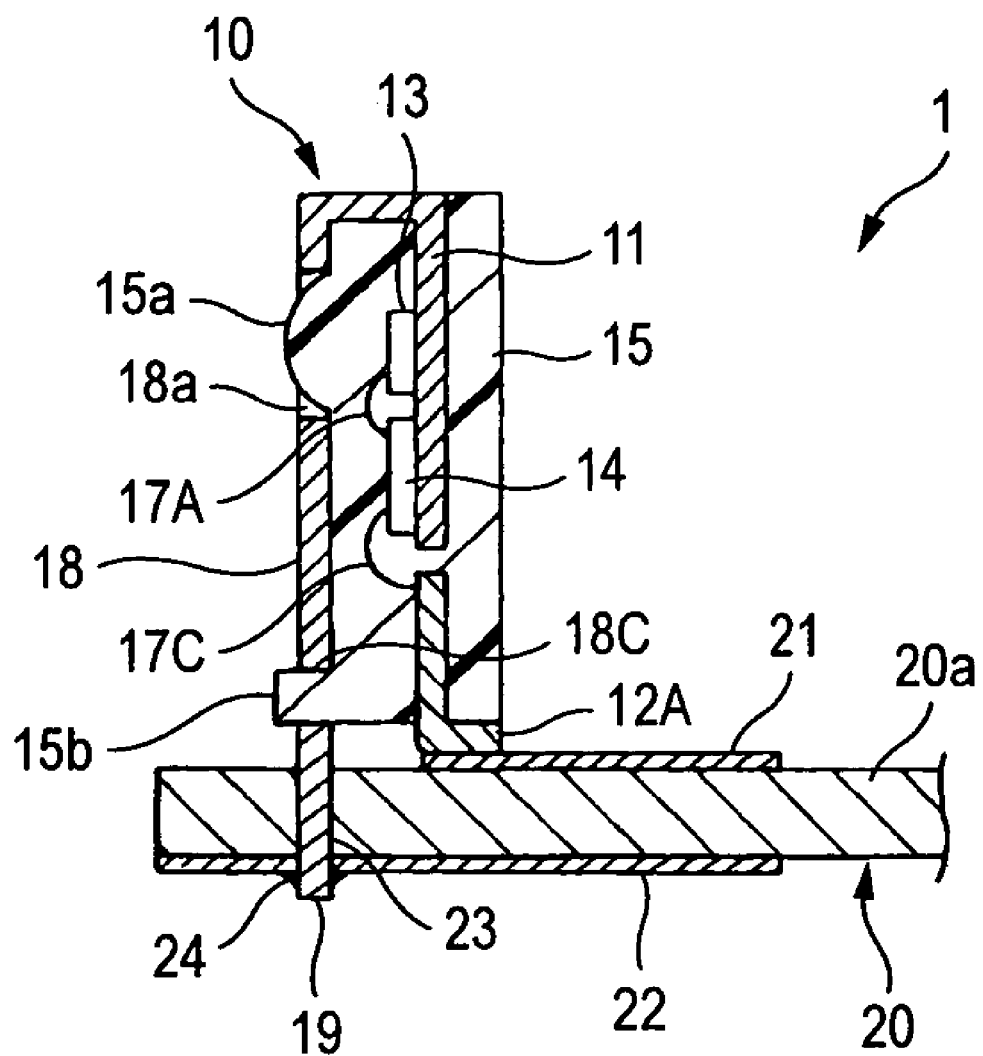
FIG. 7 is a cross sectional view of an optical transmission device according to a third embodiment of the present invention.

FIG. 7 shows an optical module according to a third embodiment of the present invention. The optical module of the third embodiment differs from that of the second embodiment in that the optical module of the third embodiment does not include the second sealing member 16 of the second embodiment and has a protruded fixing portion 15*b* provided in a front plane of the first sealing member 15 (the mounting surface of the second lead frame 18) and an opening 18c, into which the fixing portion 15b can be fitted, provided in the second lead frame 18. Other constructive components of the third embodiment are substantially the same as those of the second embodiment.

According to the third embodiment, the second lead frame 18 can be exactly positioned with respect to the first sealing member 15 by the provision of the fixing portion 15b and the opening 18c. Therefore, there is no positional deviation of the opening 18a with respect to the light emitting element 13, so that it is possible to transmit an optical signal from the light emitting element 13 to the optical fiber 30 without waste.

Other Embodiments

Incidentally, the present invention is not limited to the described embodiments and the described embodiments can be variously modified within the scope of the present invention without changing the gist of the present invention. Further, the constructive elements in the described embodiments may be arbitrarily combined within the scope of the present invention.

In each of the described embodiments, the optical module 10 uses the light emitting element 13 as the optical semiconductor. However, it is possible to construct the optical module 10 with a light receiving element. In such case, a circuit portion including, for example, an amplifier circuit shall be used instead of the drive IC 14.

Figure 8:
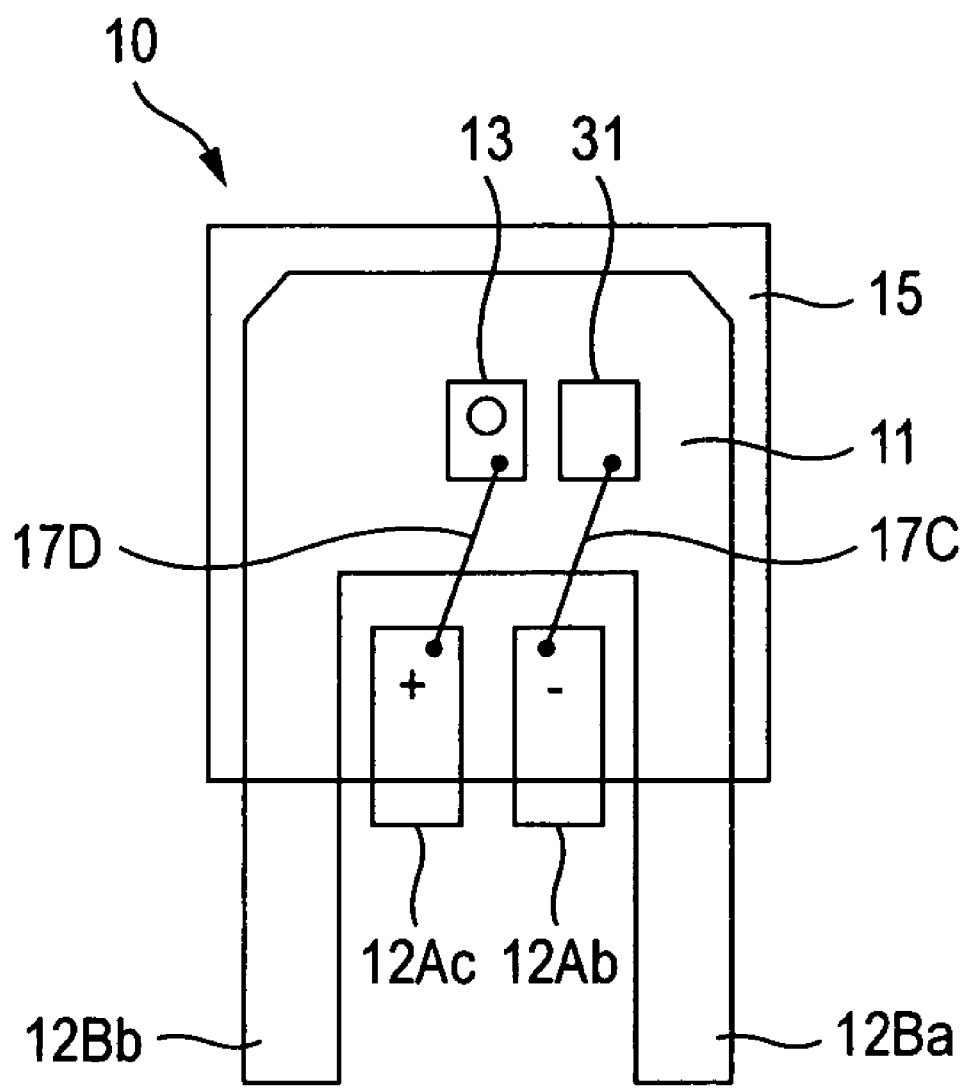
FIG. 8 is a front view of an optical module according to another embodiment of the present invention.
Figure 9:
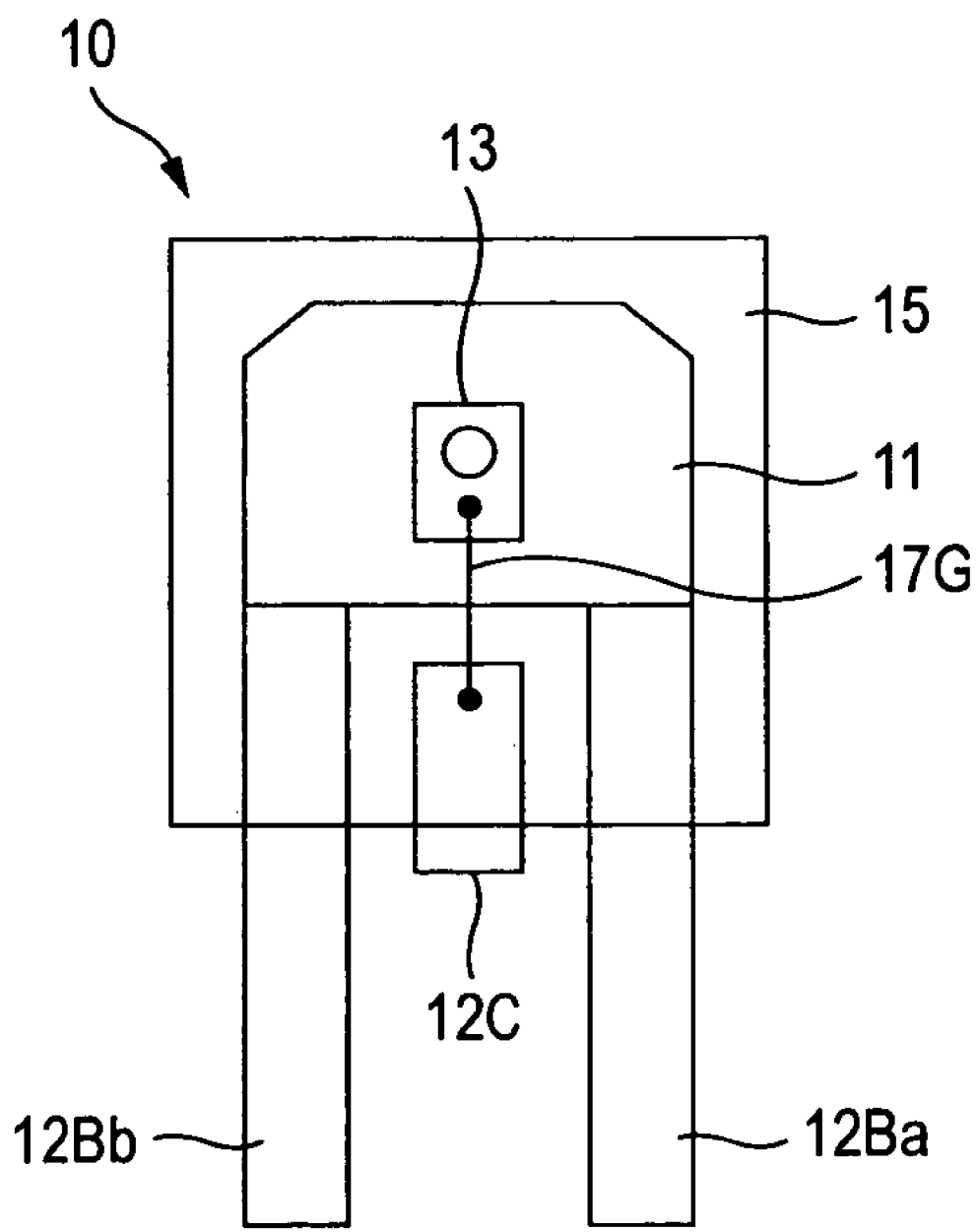
FIG. 9 is a front view of an optical module according to another embodiment of the present invention.

Though, in each of the described embodiments, the circuit portion is composed of semiconductor portions such as the light emitting element 13 and the amplifier circuit IC, an impedance control circuit (FIG. 8), in which one of externally supplied differential signals is directly supplied to the light emitting element 13 by a bonding wire 17D and the other differential signal is supplied to a resistance element 31 for impedance control through a bonding wire 17C, or a circuit (FIG. 9) composed of only a drive lead 12C and a bonding wire 17G may be used.

Further, though the optical semiconductor (light emitting element 13 or a light receiving element) and the circuit portion (drive IC 14 or the amplifier circuit) are provided in different positions of the lead frame 11, a construction, in which an optical semiconductor is mounted on the circuit portion, or a construction, in which the optical semiconductor and the circuit portion are provided integrally, may be used.

Further, both of a light emitting portion and a light receiving portion may be provided in the optical module, or a receiving optical module and a transmitting optical module may be mounted on the circuit board.

Further, though the drive IC 14 is operated by the differential signals in each of the described embodiments, a single signal can be used instead of the differential signals.

According to an aspect of the invention, the first and second lead frames may be formed by bending them. In such case, the cost reduction can be realized.

The first lead portion may include a pair of differential signal leads. Alternatively, the first lead portion may include the paired differential signal leads, a control signal lead and power supply leads. Thus, a highly reliable high speed transmission can be performed.

The second lead portion may include only a grounding lead. By using only the grounding lead as a through-lead, there is no opening for avoiding interference with other through-leads in a grounding region of the circuit board, so that rapidity of signal transmission can be improved.

The second lead portion may include a pair of grounding leads and the first lead portion may include a pair of differential signal leads having top end portions bent and arranged between the paired grounding leads.

The first lead portion may have a top end portion bent in a direction opposite to the setting direction of the optical semiconductor. In such case, it is possible to avoid waste in a wiring pattern on the circuit board and rapidity of signal transmission can be improved.

The second lead frame may have an opening in a portion thereof opposing to the optical semiconductor.

The optical semiconductor, the circuit portion and the first lead frame may be sealed by a sealing member having a fixing portion for positioning the second lead frame and the second lead frame may have an opening for receiving the fixing portion. In such case, the positioning of the second lead frame becomes easier.

The first lead portion may include a pair of differential signal leads having top ends bent and the second lead portion may include a pair of grounding leads. The circuit board may include a differential signal wiring pattern formed on a surface of the circuit board and connected to the top end portions of the paired differential signal leads and a grounding wiring pattern formed on an opposite surface of the circuit board in a position opposing to the differential signal wiring pattern and connected to the paired grounding leads through-mounted into the circuit board.

Fourth Embodiment

Figure 10:
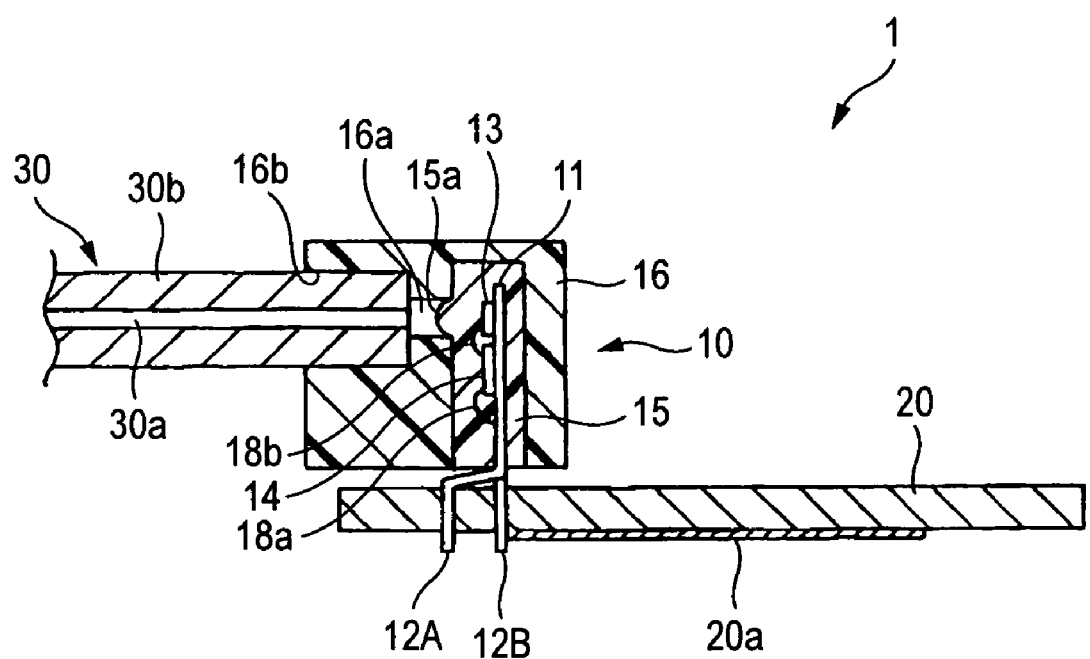
FIG. 10 is a cross sectional front view of an optical module and an optical transmission device using the same optical module according to a fourth embodiment of the present invention.
Figure 11:
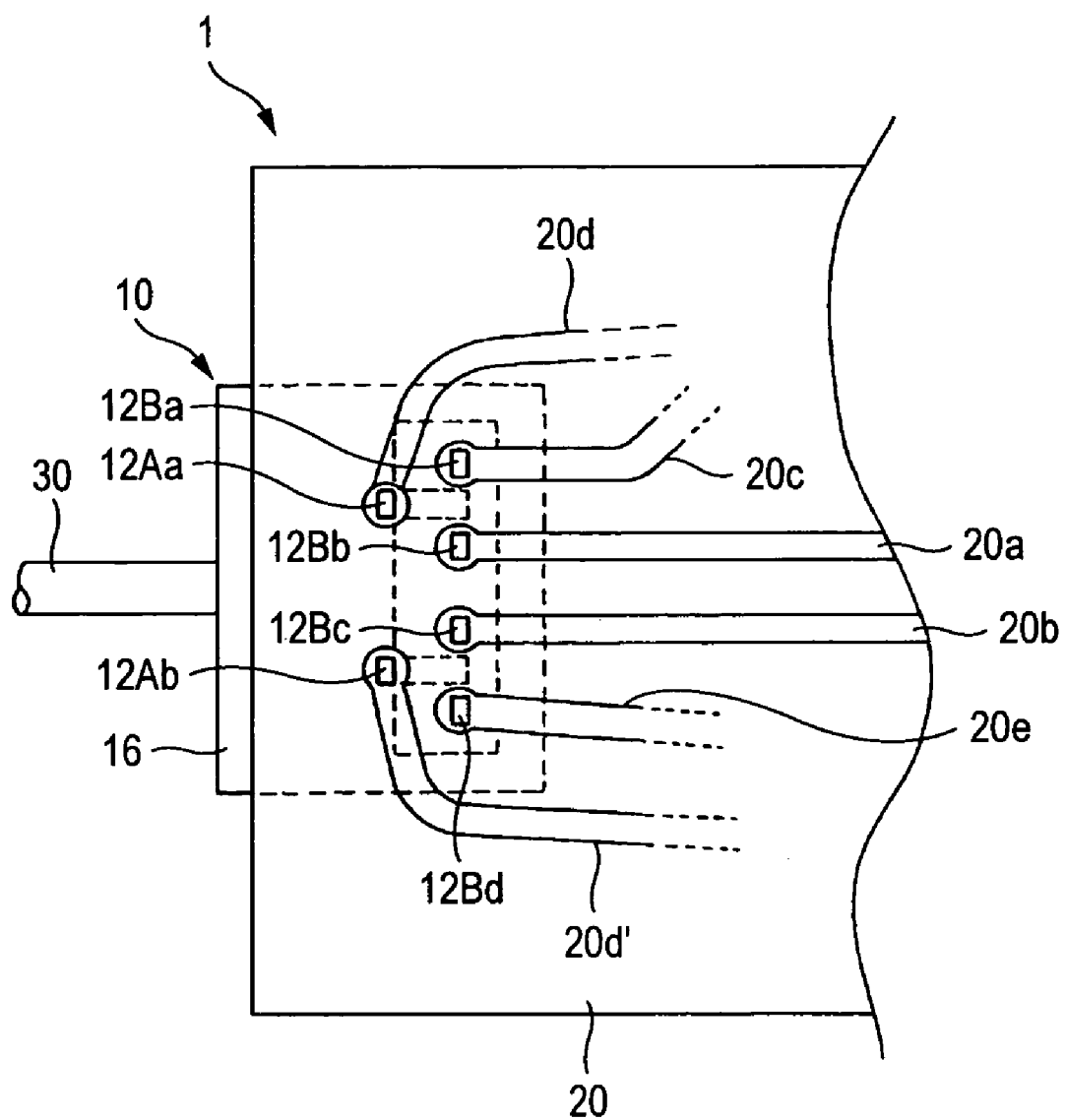
FIG. 11 is a bottom view of the optical transmission device according to the fourth embodiment.

FIG. 10 shows an optical module and an optical transmission device utilizing the optical module according to a fourth embodiment of the present invention and FIG. 11 is a bottom view of the optical transmission device.

(Construction of the Optical Transmission Device)

The optical transmission device 1 includes the optical module 10 for transmitting optical signal through an optical fiber 30 and a circuit board 20 on which the optical module 10 is mounted.

The optical module 10 includes a lead frame 11 having a predetermined shape, a plurality of leads 12A, which are bent and arranged in a front line (first line), a plurality of leads 12B arranged in a rear line (second line), a light emitting element 13 mounted on the lead frame 11 as an optical semiconductor, a drive IC 14 mounted on the lead frame 11 as a circuit portion, a first sealing member 15 formed of transparent resin for sealing a mounting portion of the lead frame 11, on which the light emitting element 13 and the drive IC 14 are mounted, such that a lens 15a is formed on a light emitting surface side of the light emitting element 13, and a second sealing member 16 for sealing the first sealing member 15 such that a space 16a is formed in front of the lens 15a and an insertion hole 16b for receiving an end portion of an optical fiber 30 is provided.

The leads 12A arranged in the front line include a lead 12Aa and a lead 12Ab as shown in FIG. 11 and the leads 12B arranged in the rear line includes four leads 12Ba to 12Bd, as shown in FIG. 11. For example, the leads 12Aa and 12Ab in the front line are grounding leads connected to the lead frame 11. Further, the lead 12Ba in the rear line is a power supply lead, the leads 12Bb and 12Bc are input leads for the differential signals S+ and S− and the lead 12Bd in the rear line is a control lead.

The leads 12Ba to 12Bd in the rear line are connected to terminals of the drive IC 14 through bonding wires 18a. The drive IC 14 and the light emitting element 13 are connected each other by a bonding wire 18b and the drive IC 14 and the lead frame 11 are connected each other by a bonding wire 18c.

As will be clear from FIG. 11, the respective leads 12 are arranged zigzag. However, one of the leads 12A in the front line arranged in between the differential signal leads 12Bb and 12Bc is removed. Therefore, the differential signal lead 12Bb becomes adjacent to the differential signal lead 12Bc in the rear line as shown in FIG. 11 despite the zigzag arrangement for reducing the pitch of the leads. Due to the existence of such empty portion in which the lead in the front line is removed, a distance between the adjacent leads 12Aa and 12Ab becomes large and there may be a case where an impedance control for the paired differential signals becomes difficult. However, in this embodiment, the impedance control is possible by making the pitch (space) of the differential signal leads 12Bb and 12Bc in the non-package portion of the circuit board 20 smaller than the pitch (space) thereof in the package portion of the circuit board 20. Although, in this case, the distance between the differential leads in the portion packaged to the circuit board 20 is large, impedance of the portion is determined by the through-holes on the side of the circuit board 20, etc. Therefore, the characteristics of the optical module 10 and the optical transmission device 1 of this embodiment is not degraded.

As shown in FIG. 11, the circuit board 20 includes differential signal wiring patterns 20a and 20b, a power supply wiring pattern 20c, the grounding wiring patterns 20d and 20d' and a control signal wiring pattern 20e.

The leads 12Bb and 12Bc in the rear line of the optical module 10 are connected to the differential signal wiring patterns 20a and 20b, respectively. The differential signal wiring pattern 20a is adjacent and in parallel to the differential signal wiring pattern 20b. The power supply wiring pattern 20c is connected to the lead 12Ba in the rear line and the grounding wiring patterns 20d and 20d' are connected to the leads 12Aa and 12Ab, respectively. Further, the control signal wiring pattern 20e is connected to the lead 12Bd in the rear line. Incidentally, through-holes for through-mounting of the leads 12A and 12B are formed on the lead side end portions of the wiring patterns 20a to 20d.

The optical fiber 30 takes in the form of a cable including a core 30a for transmitting optical signal and a clad 30b having refractive index lower than that of the core 30a and covering the core 30a.

(Operation of the Optical Transmission Device)

Figure 12:
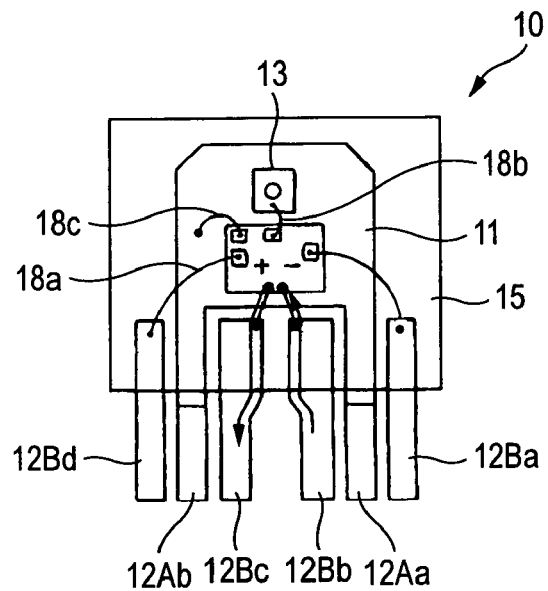
Figure 12:
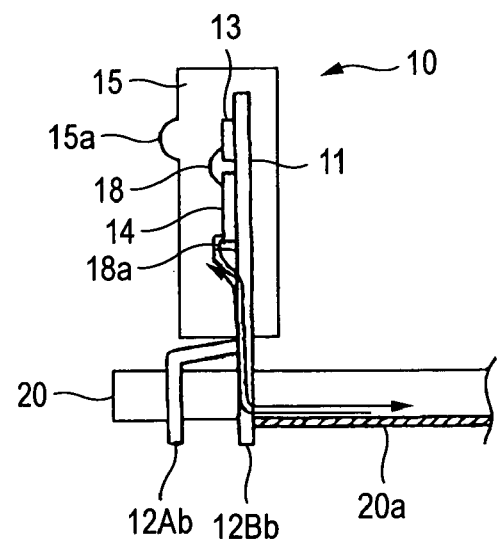
Figure 12:
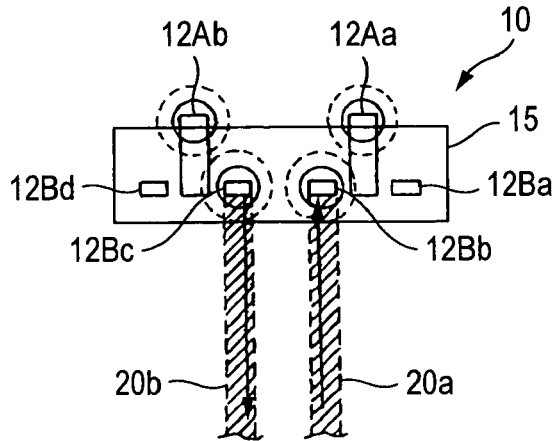

FIGS. 12(a) to 12(c) show flows of the differential currents when the optical transmission device 1 is operated. First, a predetermined DC voltage is applied between the power supply wiring pattern 20c and the grounding wiring patterns 20d and 20d'. Then, the differential signals S+ and S− having the waveforms shown in FIG. 3 are supplied to the leads 12Bc and 12Bb, respectively. By these differential signals, currents flow in arrows directions shown in FIGS. 12(a) and 12(b) and the drive IC 14 starts to operate. When the drive IC 14 is operated, the light emitting element 13 emits light having waveforms shown in FIG. 3. The light emitted by the light emitting element 13 is condensed to an end portion of the optical fiber 30 by the lens 15a and transmitted through the core 30a.

Effects of the Fourth Embodiment

According to the fourth embodiment, the following effects are obtained.

(a) In addition to the inside of the sealing member 15, a pair of adjacent and parallel signal routes of the differential signals are provided in the leads 12Bb and 12Bc and the wiring patterns 20a and 20b on the circuit board 20. Therefore, the canceling effect of noise SN is not lost and the phase shift is prevented. Consequently, the signal quality and the noise characteristics in a high frequency band of gigabit or higher can be improved.

(b) Since the difference of the optical module 10 from the prior art optical module is only the arrangement of the leads 12, the downsizing of the optical module is possible by using the low cost lead frame. Therefore, the increase of cost can be prevented and the ideal differential signal transmission can be done.

(c) By alternately bending the leads 12A and 12B arranged in a plurality of lines, it is possible to mount the leads in an extremely stuffed state.

(d) Since the lead between the differential signal leads 12Bb and 12Bc on the lead frame is removed, it is possible to ideally hold the states of the differential signals up to the circuit portion (drive IC 14), so that it is possible to realize the high speed transmission.

(e) Since the differential signal leads 12Bb and 12Bc make the distance of the portion, which is not mounted on the circuit substrate 20, shorter, the impedance control can be easily done without adverse influence on the mounting.

(f) By making the exposed portions of the differential signal leads 12Bb and 12Bc flat and arranging them in parallel, it is possible to make the differential signal leads, which are important in improving the high speed characteristics, shortest.

Fifth Embodiment

Figure 13:
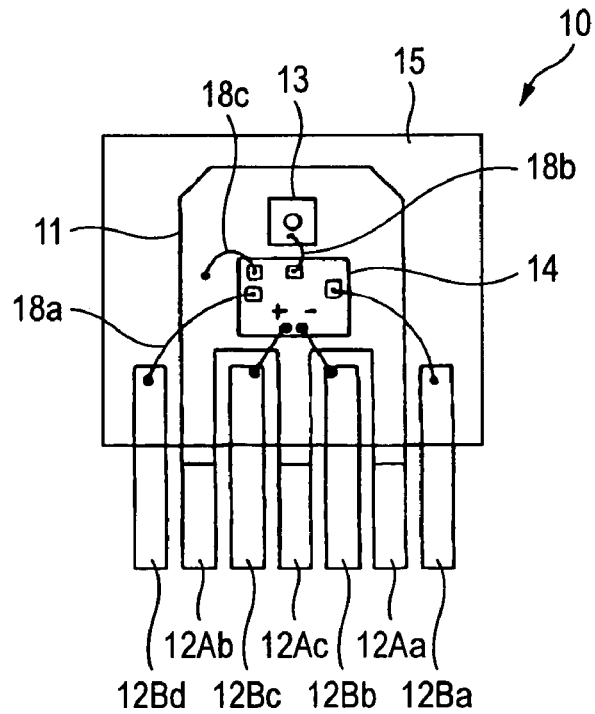
Figure 13:
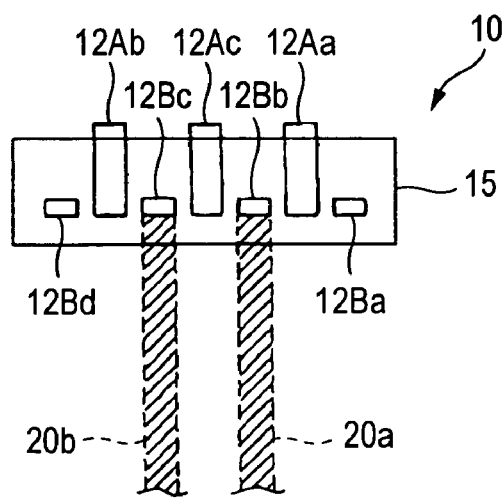

FIGS. 13(a) and 13(b) show an optical module according to a fifth embodiment of the present invention, in which FIGS. 13(a) and 13(b) are a front view and a bottom view of the optical module. Incidentally, the second sealing member 16 is not shown in FIGS. 13(a) and 13(b).

In the fifth embodiment, a lead 12Ac is derived between the leads 12Bb and 12Bc of the optical module 10 of the fourth embodiment and is arranged between the leads 12Aa and 12Ab in the front line. The lead 12Ac is connected to, for example, the lead frame 11.

According to the fifth embodiment, though the lead 12Ac is arranged between the differential signal leads 12Bb and 12Bc, it is possible to form an ideal differential pair outside the sealing members 15 and 16. Since the influence on the differential signal leads 12Bb and 12Bc is conspicuous outside the sealing members 15 and 16, it is possible to obtain a similar effect to that of the fourth embodiment.

Sixth Embodiment

Figure 14:
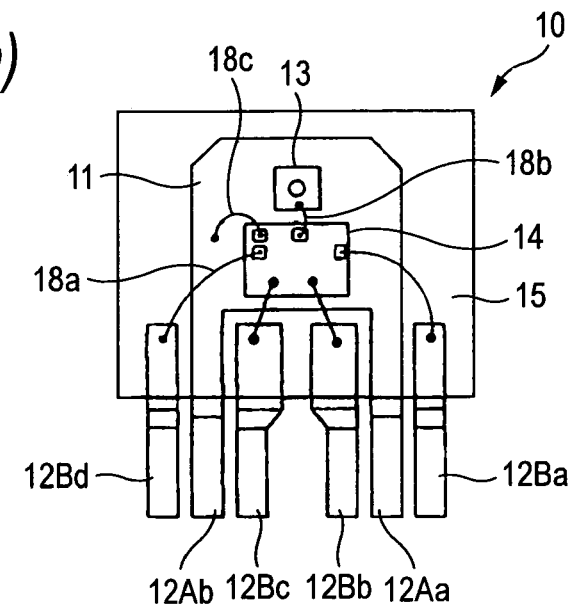
Figure 14:
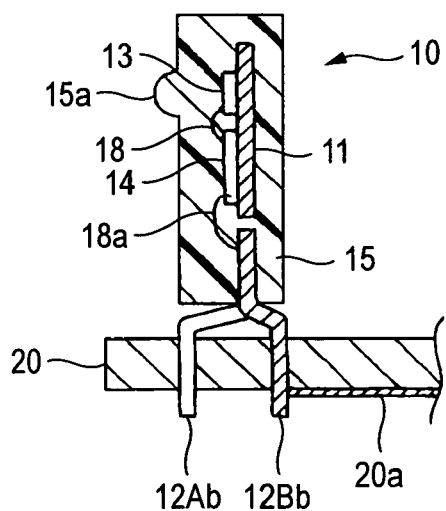
Figure 14:
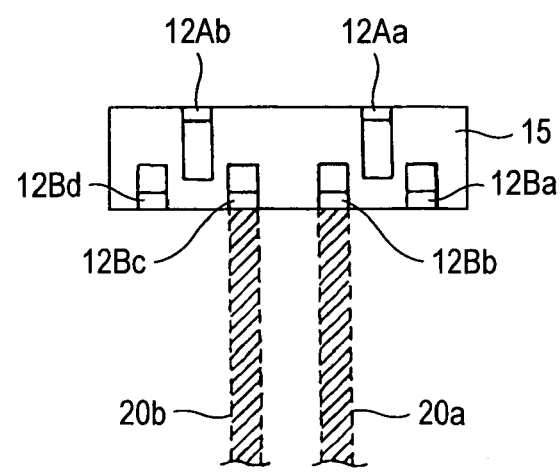

FIGS. 14(a) to 14(c) show an optical module according to a sixth embodiment of the present invention, in which FIG. 14(a) is a front view of the optical module, FIG. 14(b) is a cross sectional side view of the optical module mounted on the circuit board and FIG. 14(c) is a bottom view of the optical module.

The second sealing member 16 is not shown in these figures.

This embodiment differs from the fourth embodiment in that the space between the leads 12A in the front line is expanded by bending the leads 12Ba to 12Bd in the rear line backward as shown in FIG. 14(b). The remaining portions of the sixth embodiment are the same as those of the fourth embodiment.

According to the sixth embodiment, though the differential signal leads 12B*b* and 12B*c* are slightly longer than those of the fourth embodiment, the effects thereof are substantially the same as those of the fourth embodiment and, further, it is possible to improve the stability in mounting the optical module on the circuit board. Incidentally, it may be possible to bend only the differential signal leads 12B*b* and 12B*c* or only leads 12B*a* and 12B*d* of the leads 12B*a* to 12B*d* in the rear line backward.

Seventh Embodiment

Figure 15:
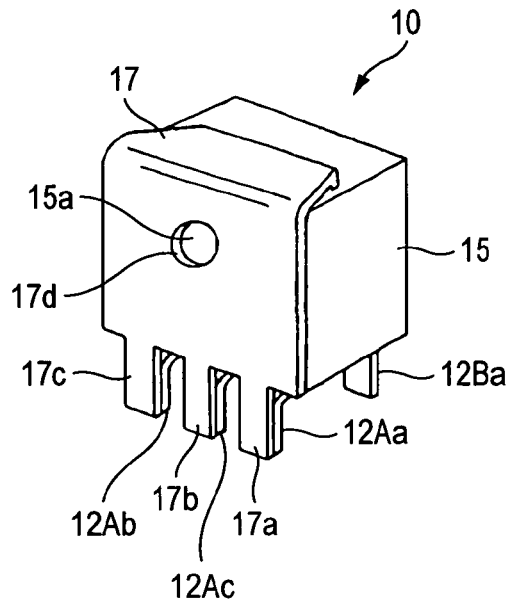
Figure 15:
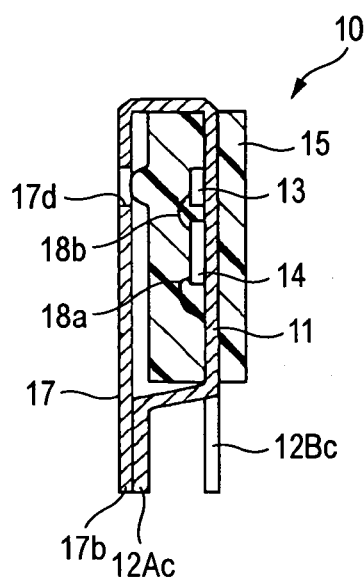
Figure 15:
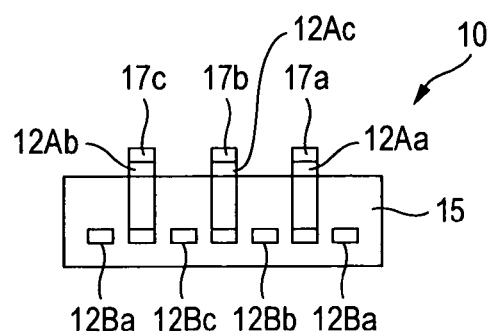

FIGS. 15(*a*) to 15(*c*) show an optical module according to a seventh embodiment of the present invention, in which FIG. 15(*a*) is a perspective view of the optical module, FIG. 15(*b*) is a cross sectional side view thereof and FIG. 15(*c*) is a bottom view thereof. In these figures, the second sealing member 16 is not shown. The seventh embodiment is substantially the same as the fifth embodiment shown in FIGS. 13(*a*) and 13(*b*) except that a second lead frame 17 including the leads 12A*a* to 12A*c* in the front line is provided in the seventh embodiment.

As shown in FIG. 15(*a*), the second lead frame 17 covers the light emitting surface in a state where an upper portion of the lead frame 17 is connected to the upper portion of the lead frame 11. Further, the lead frame 17 has an opening 17*d* in a position corresponding to the lens 15*a* such that light from the light emitting element 13 is not blocked. Further, as shown in FIGS. 15(*b*) and 15(*c*), leads 17*a* to 17*c* are provided in a lower end of the lead frame 17 such that the leads 17*a* to 17*c* lay on the respective leads 12A*a* to 12A*c* in the front line to ground them.

According to the seventh embodiment, the front and the rear surfaces of the drive IC 14 and the light emitting element 13 can be sealed by the lead frame 11 and the second lead frame 17, respectively. Therefore, it is possible to further improve the noise characteristics compared with the fourth to sixth embodiments. Further, the second lead frame 17 can function as a heat radiator.

Eighth Embodiment

Figure 16:
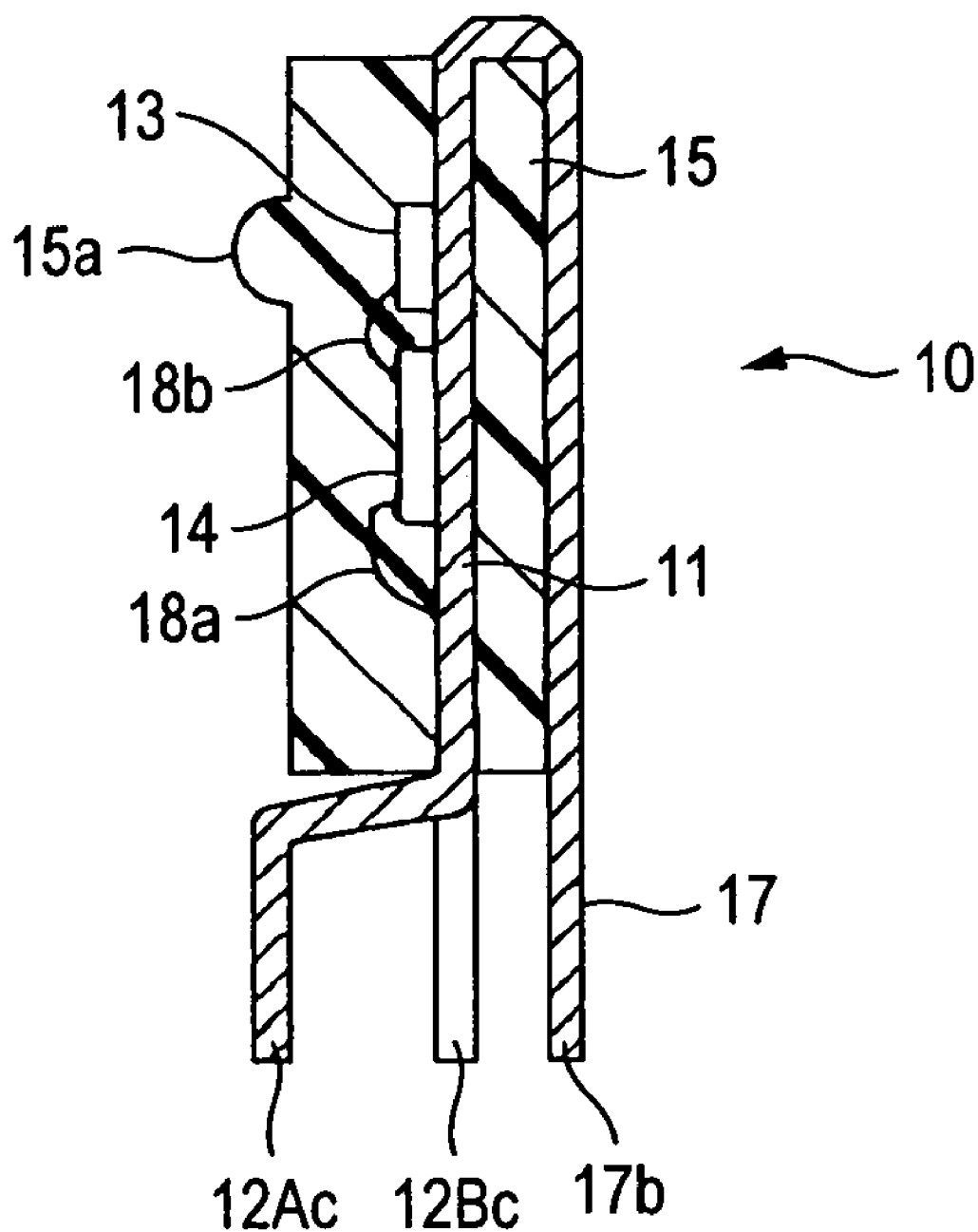
FIG. 16 is a cross sectional side view showing an optical module according to an eighth embodiment of the present invention.

FIG. 16 shows an optical module according to an eighth embodiment of the present invention. The second sealing member 16 is not shown in FIG. 16. The eighth embodiment is substantially the same as the seventh embodiment except that the second lead frame 17 is provided on a rear surface of the lead frame 11.

According to the eighth embodiment, the second lead frame 17 can be made a third line similarly to the seventh embodiment. Therefore, it is possible to stably stand the optical module 10 when the latter is through-mounted on the circuit board. Further, the heat radiation and the shielding characteristics can be improved.

Ninth Embodiment

Figure 17:
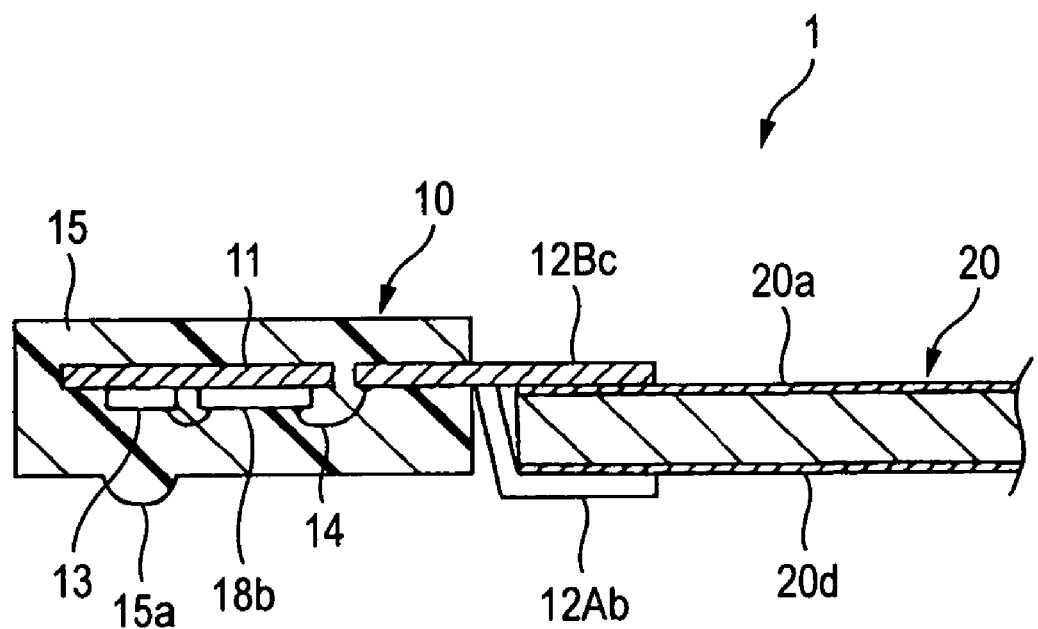
FIG. 17 is a cross sectional side view showing an optical transmission device according to a ninth embodiment of the present invention.
Figure 18:
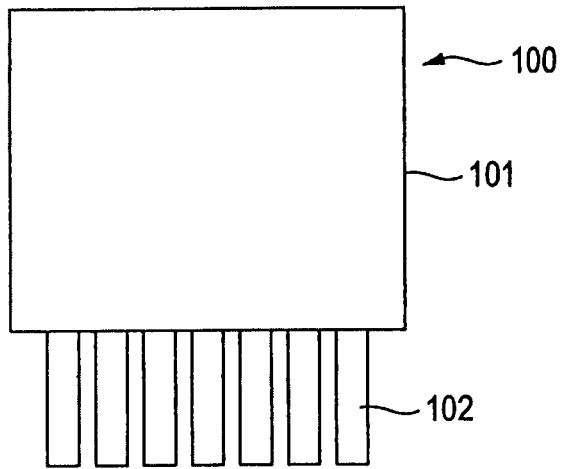
Figure 18:
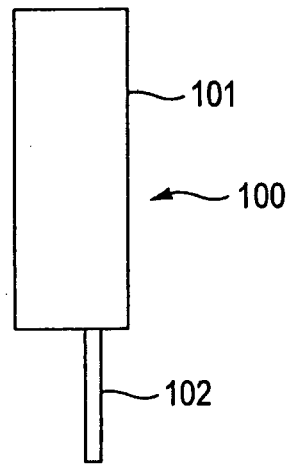
Figure 18:
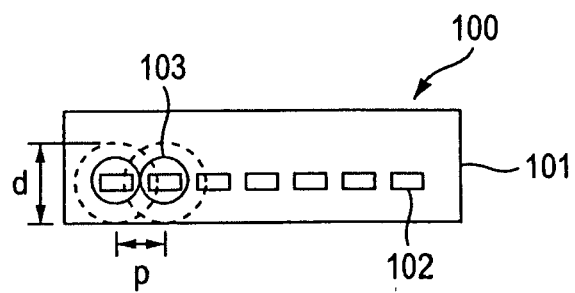
Figure 19:
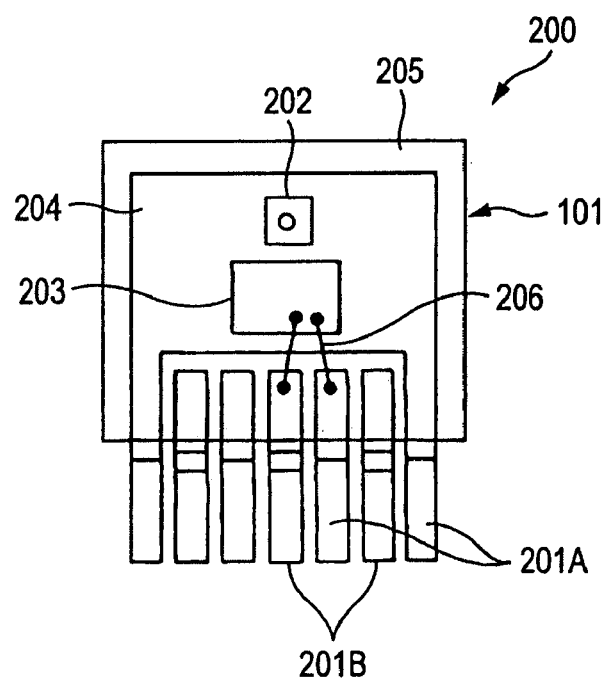
Figure 19:
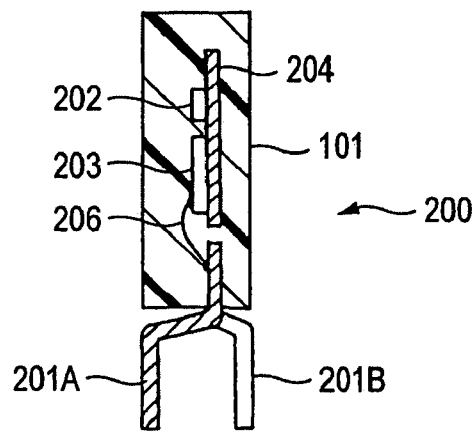
Figure 19:
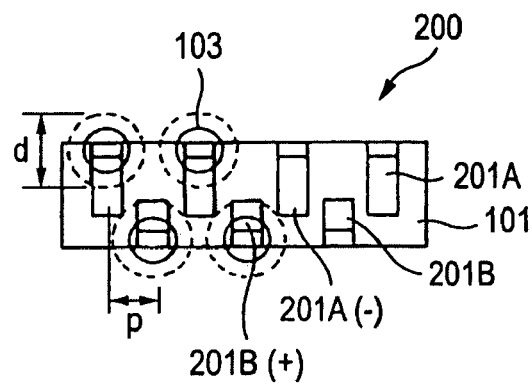

FIG. 17 shows an optical transmission device according to a ninth embodiment of the present invention. The second sealing member 16 is not shown in FIG. 17. The ninth embodiment is substantially the same as the fourth embodiment except that, in order to surface-mount the optical module on the surfaces of the circuit substrate 20, the leads 12A and 12B are connected to the wiring patterns while pinching the circuit substrate 20 thereby.

According to the ninth embodiment, substantially the same effects as those of the fourth embodiment can be obtained. Further, it is possible to reduce the thickness of the optical transmission device.

Other Embodiments

Incidentally, the present invention is not limited to the described embodiments and the described embodiments can be variously modified within the scope of the present invention without changing the gist of the present invention. Further, the constructive elements in the described embodiments may be arbitrarily combined within the scope of the present invention without changing the gist of the present invention.

In each of the described embodiments, the optical module 10 uses the light emitting element 13 as the optical semiconductor. However, it is possible to construct the optical module 10 with a light receiving element. In such case, a circuit portion including, for example, an amplifier circuit shall be used instead of the drive IC 14.

In each of the described embodiments, the optical semiconductor (the light emitting element 13 or the light receiving element) and the circuit portion (the drive IC 14 or the amplifier circuit) are provided in different positions on the lead frame 11. However, the optical semiconductor may be mounted on the circuit portion or the optical semiconductor and the circuit portion may be integrated.

Further, a light emitting portion and a light receiving portion may be mixed in the optical module. Alternatively, a receiving optical module and a transmitting optical module may be mounted on the circuit board.

According to an aspect of the invention, it is possible to arrange the plurality of the leads zigzag in the at least two lines.

Also, it is possible to arrange the plurality of the leads in the at least two lines by bending some of the plurality of the leads. In such case, it is possible to provide a stable package.

The differential signal leads may include a package portion mounted on the circuit board and non-package portions, which are not mounted on the circuit board, and the pitch of the differential signal leads in the non-package portions may be made smaller than the pitch thereof in the package portions.

The paired differential signal leads, which are arranged zigzag in the at least two lines, may be arranged in one of the lines and one of the leads arranged in another one of the lines and positioned between the paired differential signal leads may be removed.

The plurality of the leads may be arranged in two lines by bending the leads in opposite directions alternately. In such case, it is possible to provide a stable package.

The optical semiconductor and the circuit portion may be mounted on a lead frame electrically connected to grounding leads of the plurality of the leads and the lead frame may include a second lead frame extending from the lead frame on an upper surface side or a lower surface side of the lead frame. In such case, it is possible to improve the EMC performance.

The second lead frame may be connected to the lead frame mounting the optical semiconductor.

Furthermore, the plurality of the leads may be through-mounted in the circuit board. In such case, the packaging becomes easy.

The plurality of the leads may be arranged in two lines with pitch corresponding to thickness of the circuit board and surface-mounted on the upper surface of the circuit board. In such case, it is possible to reduce the thickness of the optical transmission device.

The entire disclosure of Japanese Patent Applications No. 2005-195018 filed on Jul. 4, 2005 and No. 2005-196916 filed on Jul. 5, 2005 including specifications, claims, drawings and abstracts is incorporated herein by reference in its entirety.

What is claimed is:

1. An optical module comprising:
a plurality of leads extending from one or more sealing members, at least portions of the leads being mounted on a circuit board at respective mounting positions arranged along only two parallel, non-overlapping rows on the circuit board, each of the rows having a plurality of mounting positions, at least one of the rows containing at least three of the respective mounting positions;
an optical semiconductor for emitting or receiving an optical signal; and
a circuit portion embedded in at least one sealing member and the at least one sealing member forming a lens, and the circuit portion connected to the optical semiconductor, for transmitting a pair of differential signals to or receiving a pair of differential signals from the circuit board through a pair of differential signal leads of the leads, the pair of differential signal leads connecting the circuit portion and the circuit board, wherein
the pair of the differential signal leads are adjacent to each other, mounted on the circuit board in a first of the two rows, and parallel so that a distance between the differential signal leads remains constant from a lower surface of the one or more sealing members to an upper surface of the circuit board,
the distance between the pair of the differential signal leads is determined by measuring the distance between two respective edges of the pair of the differential signal leads that are farthest away from each other,
the leads form a zigzag pattern so that imaginary columns intersect each row at each of the leads, the imaginary columns being orthogonal to the rows, each imaginary column containing only one lead, and
there is no lead in a second of the two rows between the imaginary columns that intersect the differential signal leads.

2. An optical module as claimed in claim 1, wherein the leads are provided in the rows on the circuit board by bending portions of the leads.

3. An optical module as claimed in claim 1, wherein the pair of the differential signal leads include mounting portions mounted on the circuit board and non-mounting portions, which are not mounted on the circuit board, and a pitch of the non-mounted portions is smaller than a pitch of the mounting portions.

4. An optical module as claimed in claim 1, wherein the leads in the second of the two rows are bent.

5. An optical module as claimed in claim 1, wherein
the optical semiconductor and the circuit portion are mounted on a lead frame electrically connected to grounding leads among the leads, and
a second lead frame extends from the lead frame on an upper surface side or a lower surface side of the lead frame.

6. An optical module as claimed in claim 5, wherein the second lead frame is connected to the lead frame mounting the optical semiconductor.

7. The optical module as claimed in claim 1, wherein the pair of the differential signal leads are bent to form L-shapes extending along a lower surface of a sealing member that seals a portion of the leads to mount the optical module to the circuit board.

8. The optical module as claimed in claim 1, including a second lead frame arranged in a position which is remote from a first lead frame by a predetermined distance, in an opposing relation to the first lead frame, a portion of the leads extending from the first and second lead frames.

9. The optical module as claimed in claim 1, wherein the one or more sealing members have a protruding fixing portion provided in a front plane of the one or more sealing members and an opening of a lead frame connected to a portion of the leads into which the fixing portion can be fitted.

10. An optical transmission device comprising:
a circuit board having a pair of differential signal lead patterns supplied with a pair of differential signals;
a plurality of leads mounted on the circuit board at respective mounting positions arranged in only two parallel, non-overlapping rows, each of the rows having a plurality of mounting positions, at least one of the rows containing at least three of the respective mounting positions;
an optical semiconductor for emitting or receiving an optical signal; and
a circuit portion embedded in a seal that forms a lens and connected to the optical semiconductor and to a portion of the leads, for transmitting the pair of the differential signals to or receiving the pair of the differential signals from the circuit board through a pair of differential signal leads of the leads, wherein
the pair of the differential signal leads are adjacent to each other, mounted on the circuit board in a first of the two rows, and parallel so that a distance between the differential signals leads remains constant from a lower surface of a sealing member to an upper surface of the circuit board,
the leads form a zigzag pattern so that imaginary columns intersect each row at each of the leads, the imaginary columns being orthogonal to the rows, each imaginary column containing only one lead, and
there is no lead in a second of the two rows between the imaginary columns that intersect the differential signal leads.

11. An optical transmission device as claimed in claim 10, wherein a portion of the leads are through-mounted in the circuit board.

* * * * *